(12) United States Patent
Huebner (10) Patent No.: US 12,166,466 B2
(45) Date of Patent: Dec. 10, 2024

(54) TRIM LAYERS FOR SURFACE ACOUSTIC WAVE DEVICES

(71) Applicant: Qorvo US, Inc., Greensboro, NC (US)

(72) Inventor: Sebastian Huebner, Munich (DE)

(73) Assignee: Qorvo US, Inc., Greensboro, NC (US)

( * ) Notice: Subject to any disclaimer, the term of this patent is extended or adjusted under 35 U.S.C. 154(b) by 1238 days.

(21) Appl. No.: 16/212,809

(22) Filed: Dec. 7, 2018

(65) Prior Publication Data

US 2020/0007108 A1   Jan. 2, 2020

Related U.S. Application Data (60) Provisional application No. 62/692,940, filed on Jul. 2, 2018.

(51) Int. Cl.
  *H03H 9/02* (2006.01)
  *H03H 3/10* (2006.01)
  *H03H 9/145* (2006.01)
  *H03H 9/25* (2006.01)
  *H03H 9/64* (2006.01)

(52) U.S. Cl.
  CPC .......... *H03H 9/02834* (2013.01); *H03H 3/10* (2013.01); *H03H 9/02559* (2013.01); *H03H 9/02637* (2013.01); *H03H 9/145* (2013.01); *H03H 9/25* (2013.01); *H03H 9/6489* (2013.01); *H03H 9/02622* (2013.01)

(58) Field of Classification Search
  CPC .................................. H03H 9/25; H03H 9/64
  See application file for complete search history.

(56) References Cited

U.S. PATENT DOCUMENTS 7,589,452 B2 *   9/2009  Hauser ............... H03H 9/02834
                                                     310/313 R
8,084,916 B2 * 12/2011  Goto .................. H03H 9/02897
                                                     310/313 R (Continued)

OTHER PUBLICATIONS

Day, John, et al., "Bias Controlled Frequency Trimming of SAW Devices in a DC 02 Plasma," 38th Annual Frequency Control Symposium, 1984, IEEE, pp. 310-314.

(Continued)

*Primary Examiner* — Andrea Lindgren Baltzell
*Assistant Examiner* — Alan Wong
(74) *Attorney, Agent, or Firm* — Withrow & Terranova, P.L.L.C.

(57) ABSTRACT

Trim layers that are configured to adjust one or more operating parameters for surface acoustic wave (SAW) devices are disclosed. A SAW device may include an interdigital transducer (IDT) and a piezoelectric material that are configured to generate an acoustic wave and a trim layer that has an acoustic velocity and a density that correspond to a velocity of the acoustic wave. In this manner, the trim layer may be configured to adjust an electromechanical coupling of the SAW device without significantly impacting a resonance frequency of the SAW device. The SAW device may also include an additional trim layer that is configured to adjust a coupling percentage and the resonance frequency of the SAW device. A SAW device may include a trim layer that is configured to adjust certain operating parameters by greater amounts than other operating parameters.

22 Claims, 8 Drawing Sheets

(56) References Cited

U.S. PATENT DOCUMENTS

| | | | | |
|---|---|---|---|---|
| 8,716,922 B2* | 5/2014 | Kawanishi | | H03H 9/215 |
| | | | | 310/370 |
| 9,159,900 B2* | 10/2015 | Tamasaki | | H10N 30/88 |
| 9,190,981 B2* | 11/2015 | Kando | | H03H 9/02574 |
| 9,640,750 B2* | 5/2017 | Nakanishi | | H03H 9/02834 |
| 10,530,333 B2* | 1/2020 | Kishimoto | | H03H 3/08 |
| 10,979,020 B2* | 4/2021 | Nosaka | | H03H 9/02007 |
| 11,095,269 B2* | 8/2021 | Komatsu | | H03H 9/6483 |
| 11,374,550 B2* | 6/2022 | Daimon | | H03H 9/02834 |

OTHER PUBLICATIONS

Juang, H., et al., "Effect of deposition conditions on mechanical properties of low-temperature PECVD silicon nitride films," Materials Science and Engineering, 2006, Elsevier B.V., pp. 453-459.

Isono, Yoshitada, et al., "Effect of Gas Flow Ratio in PE-CVD on Elastic Properties of Sub-Micron Thick Silicon Nitride Films for MEMS," The 13th International Conference on Solid-State Sensors, Actuators, and Microsystems, Jun. 5-9, 2005, Seoul, Korea, IEEE, pp. 847-850.

Nishimura, Atsushi, et al., "Frequency response study of surface acoustic wave devices with SiOxNy film using LiTaO3 substrate," Japanese Journal of Applied Physics, vol. 57, Jun. 2018, Japan Society of Applied Physics, 5 pages.

Nishimura, Atsushi, et al., "Study for Frequency Response of SAW Devices with SiONy Film Using LiTaO3 Substrate," Proceedings of Symposium on Ultrasonic Electronics, vol. 38, Oct. 25-28, 2017, IEEE, 2 pages.

Nishimura, Atsushi, et al., "Study for Temperature Coefficient of Frequency of Surface Acoustic Wave Devices with SioxNy Film Using LiTaO3 Substrate," International Ultrasonics Symposium, Oct. 22-25, 2018, Kobe, Japan, IEEE, 4 pages.

Tang, Chien-Jen, et al., "Optical, structural, and mechanical properties of silicon oxynitride films prepared by pulsed magnetron sputtering," Applied Optics, vol. 56, Issue 4, Feb. 1, 2017, Optical Society of America, 7 pages.

\* cited by examiner

TRIM LAYERS FOR SURFACE ACOUSTIC WAVE DEVICES

RELATED APPLICATIONS

This application claims the benefit of provisional patent application Ser. No. 62/692,940, filed Jul. 2, 2018, the disclosure of which is hereby incorporated herein by reference in its entirety.

FIELD OF THE DISCLOSURE

The present disclosure relates to acoustic wave devices, and particularly to trim layers for surface acoustic wave (SAW) devices.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio frequency (RF) filters. For example, SAW filters are commonly used in second generation (2G), third generation (3G), and fourth generation (4G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As the use of SAW devices in modern RF communication systems and mobile devices increases, the art continues to seek improved SAW devices while being capable of overcoming challenges associated with conventional devices.

SUMMARY

The present disclosure relates to acoustic wave devices, and particularly to trim layers for surface acoustic wave (SAW) devices. Representative SAW devices are described herein that include one or more trim layers that are configured to adjust one or more operating parameters of the SAW devices. The adjustment of one or more operating parameters is desirable to accommodate operating parameter variations due in part to manufacturing and material tolerances for SAW devices. A SAW device may include an interdigital transducer (IDT) and a piezoelectric material that are configured to generate an acoustic wave and a trim layer that has an acoustic velocity and density that correspond to a velocity of the acoustic wave. In this manner, the trim layer may be configured to adjust an electromechanical coupling of the SAW device without significantly impacting a resonance frequency of the SAW device. In certain embodiments, a SAW device may include an additional trim layer that is configured to adjust an electromechanical coupling and a resonance frequency of the SAW device. As described herein, SAW devices are provided with improved trimming configurations that are capable of adjusting for a wider range of operating parameter variations.

In one aspect, a SAW device comprises: a piezoelectric material; an IDT on the piezoelectric material; a first trim layer that is configured to cover the IDT and at least a portion of the piezoelectric material that is not covered by the IDT, wherein the first trim layer is configured to adjust a first operating parameter of the SAW device; and a second trim layer that is configured to cover the IDT and at least a portion of the piezoelectric material that is not covered by the IDT, wherein the second trim layer is configured to adjust a second operating parameter while having a reduced impact on the first operating parameter. The first operating parameter may be a resonance frequency of the SAW device and the second operating parameter may be an electromechanical coupling of the SAW device. In certain embodiments, the second trim layer comprises an acoustic velocity and density that correspond to a velocity of an acoustic wave in the piezoelectric material such that a thickness of the second trim layer has a reduced impact on the resonance frequency. The first trim layer may be configured to adjust the first operating parameter and the second operating parameter of the SAW device. In certain embodiments, the first trim layer is configured between the second trim layer and the IDT. In other embodiments, the second trim layer is configured between the first trim layer and the IDT. The second trim layer may comprise silicon oxynitride. In certain embodiments, the silicon oxynitride comprises an oxygen content that is about 40% to 80% of a total content of oxygen and nitrogen. The oxygen content may comprise a range of about 50% to about 70% of the total content of oxygen and nitrogen. In certain embodiments, the first trim layer comprises silicon nitride or silicon dioxide. In certain embodiments, the first trim layer comprises silicon oxynitride and the second trim layer comprises silicon oxynitride having a different composition than the first trim layer.

In certain embodiments, the SAW device further comprises a passivation layer that is configured to cover the IDT and at least a portion of the piezoelectric material that is not covered by the IDT, wherein the passivation layer is between the first trim layer and the piezoelectric material. The passivation layer may be configured to adjust at least one of the first operating parameter or the second operating parameter. In certain embodiments, a passivation layer is configured between the first trim layer and the second trim layer. In other embodiments, the first trim layer and the second trim layer are both between a passivation layer and the piezoelectric material. In certain embodiments, the SAW device may further comprise a dielectric layer between the first trim layer and the piezoelectric material, wherein the dielectric layer is configured to reduce a temperature coefficient of frequency of the SAW device. The dielectric layer may comprise a top surface with a shape that is conformal to the IDT and the piezoelectric material. In another aspect, a method comprises: forming a SAW device comprising a piezoelectric material and an IDT that is on the piezoelectric material; depositing a first trim layer on the IDT and at least a portion of the piezoelectric material that is not covered by the IDT; reducing a thickness of the first trim layer; depositing a second trim layer on the first trim layer after the thickness of the first trim layer has been reduced; and reducing a thickness of the second trim layer. In certain embodiments, at least one of the first trim layer and the second trim layer comprises silicon oxynitride. In certain embodiments, the first trim layer or the second trim layer comprises an acoustic velocity and density that correspond to a velocity of an acoustic wave in the piezoelectric material. The acoustic velocity and density of the first trim layer or the second trim layer may be configured such that a thickness of the first trim layer or the second trim layer has a reduced impact on a resonance frequency of the SAW device.

In another aspect, a SAW device comprises: a piezoelectric material; an IDT on the piezoelectric material; and a first trim layer that is configured to cover the IDT and at least a portion of the piezoelectric material that is not covered by the IDT, wherein the first trim layer comprises silicon oxynitride. In certain embodiments, the first trim layer comprises an acoustic velocity and a density that are configured such that a thickness of the first trim layer changes a resonance frequency of the SAW device by a greater amount than an electromechanical coupling of the SAW device. The first trim layer may comprise an acoustic velocity and a density that are configured such that a thickness of the first trim layer changes an electromechanical coupling of the SAW device by a greater amount than a resonance frequency of the SAW device. In certain embodiments, the SAW device further comprises a second trim layer that comprises silicon nitride or silicon dioxide. In certain embodiments, the SAW device further comprises a second trim layer that comprises silicon oxynitride with a different composition than the first trim layer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to acoustic wave devices, and particularly to trim layers for surface acoustic wave (SAW) devices.

Representative SAW devices are described herein that include one or more trim layers that are configured to adjust one or more operating parameters of the SAW devices. The adjustment of one or more operating parameters is desirable to accommodate operating parameter variations due in part to manufacturing and material tolerances for SAW devices. A SAW device may include an interdigital transducer (IDT) and a piezoelectric material that are configured to generate an acoustic wave and a trim layer that has an acoustic velocity and density that correspond to a velocity of the acoustic wave. In this manner, the trim layer may be configured to adjust an electromechanical coupling of the SAW device without significantly impacting a resonance frequency of the SAW device. In certain embodiments, a SAW device may include an additional trim layer that is configured to adjust a coupling percentage and a resonance frequency of the SAW device. As described herein, SAW devices are provided with improved trimming configurations that are capable of adjusting for a wider range of operating parameter variations.

Figure 1:
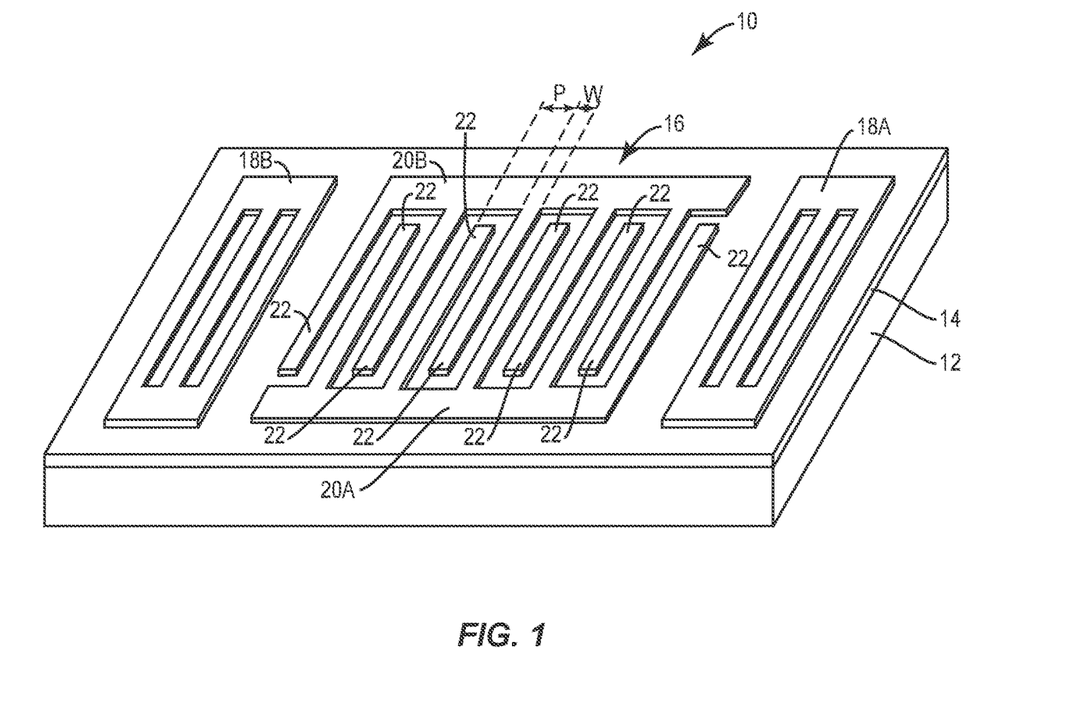
FIG. 1 is a perspective view illustration of a representative SAW device.

Before describing particular embodiments of the present disclosure further, a general discussion of SAW devices is provided. FIG. 1 is a perspective view illustration of a representative SAW device 10. The SAW device 10 includes a substrate 12, a piezoelectric layer 14 on the substrate 12, an IDT 16 on a surface of the piezoelectric layer 14 opposite the substrate 12, a first reflector structure 18A on the surface of the piezoelectric layer 14 adjacent to the IDT 16, and a second reflector structure 18B on the surface of the piezoelectric layer 14 adjacent to the IDT 16 opposite the first reflector structure 18A.

The IDT 16 includes a first electrode 20A and a second electrode 20B, each of which include a number of electrode fingers 22 that are interleaved with one another as shown. The first electrode 20A and the second electrode 20B may also be referred to as comb electrodes. A lateral distance between adjacent electrode fingers 22 of the first electrode 20A and the second electrode 20B defines an electrode pitch P of the IDT 16. The electrode pitch P may at least partially define a center frequency wavelength A of the SAW device 10, where the center frequency is the primary frequency of mechanical waves generated in the piezoelectric layer 14 by the IDT 16. For a single electrode IDT 16 such as the one shown in FIG. 1, the center frequency wavelength A is equal to twice the electrode pitch P. For a double electrode IDT 16, the center frequency wavelength A is equal to four times the electrode pitch P. A finger width W of the adjacent electrode fingers 22 over the electrode pitch P may define a metallization ratio, or duty factor, of the IDT 16, which may dictate certain operating characteristics of the SAW device 10.

In operation, an alternating electrical input signal provided at the first electrode 20A is transduced into a mechanical signal in the piezoelectric layer 14, resulting in one or more acoustic waves therein. In the case of the SAW device 10, the resulting acoustic waves are predominately surface acoustic waves. As discussed above, due to the electrode pitch P and the metallization ratio of the IDT 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in the impedance and/or a phase shift between the first electrode 20A and the second electrode 20B with respect to the frequency of the alternating electrical input signal. An alternating electrical potential between the two electrodes 20A and 20B creates an electrical field in the piezoelectric layer 14 which generate acoustic waves. The acoustic waves travel at the surface and eventually are transferred back into an electrical signal between the electrodes 20A and 20B. The first reflector structure 18A and the second reflector structure 18B reflect the acoustic waves in the piezoelectric layer 14 back towards the IDT 16 to confine the acoustic waves in the area surrounding the IDT 16.

The substrate 12 may comprise various materials including glass, sapphire, quartz, silicon (Si), or gallium arsenide (GaAs) among others, with Si being a common choice. The piezoelectric layer 14 may be formed of any suitable piezoelectric material(s). In certain embodiments described herein, the piezoelectric layer 14 is formed of lithium tantalate (LT), or lithium niobate ($LiNbO_3$), but is not limited thereto. In certain embodiments, the piezoelectric layer 14 is thick enough or rigid enough to function as a piezoelectric substrate. Accordingly, the substrate 12 in FIG.

1 may be omitted. Those skilled in the art will appreciate that the principles of the present disclosure may apply to other materials for the substrate 12 and the piezoelectric layer 14. The IDT 16, the first reflector structure 18A, and the second reflector structure 18B may comprise any metal or metal alloy. While not shown to avoid obscuring the drawings, additional passivation layers, frequency trimming layers, or any other layers may be provided over all or a portion of the exposed surface of the piezoelectric layer 14, the IDT 16, the first reflector structure 18A, and the second reflector structure 18B. Further, one or more layers may be provided between the substrate 12 and the piezoelectric layer 14 in various embodiments.

The operating parameters of the SAW device 10, including resonance frequency (fs), electromechanical coupling, or coupling %, and quality factor (Q value), among others, can be influenced by configurations of various elements of the SAW device 10. These configurations of elements include material orientation and thickness of the piezoelectric layer 14, widths and thickness of the electrode fingers 22, the pitch of the electrode fingers 22, and material properties and thicknesses of other passivation layers that may be present, among others. During manufacturing of SAW devices, process variations and material tolerances for any of these elements can lead to SAW devices with variations in operating parameters, including fs and coupling. Frequency trimming layers can be provided over the IDT 16 and the piezoelectric layer 14 to adjust for such variations in the fs; however, adjustments to the frequency trimming layers also tend to adjust other operating parameters of the SAW device 10, including the coupling.

Figure 2A:
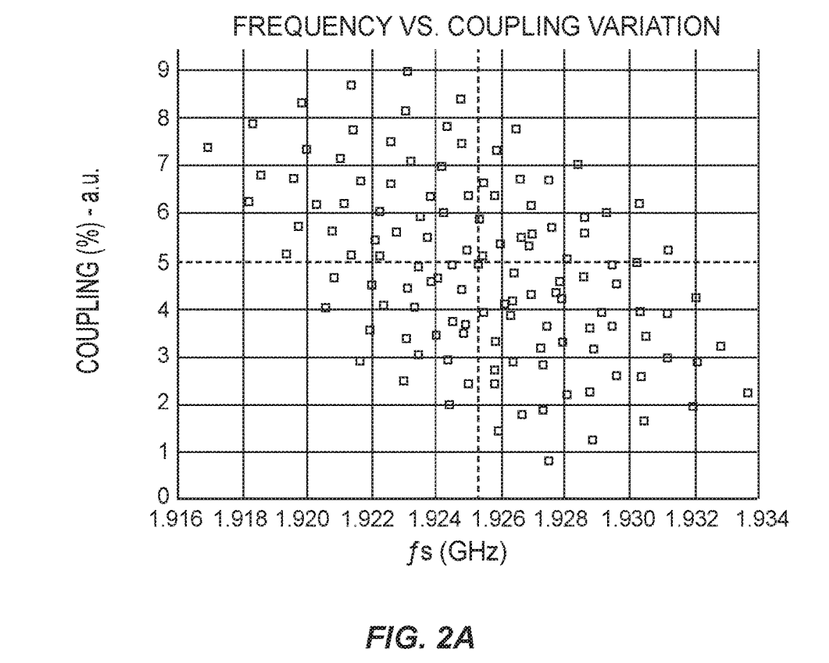
FIG. 2A is a simulation plot illustrating a distribution of resonance frequency fs and coupling % values for SAW devices with differences attributed to process variations and material tolerances.
Figure 2B:
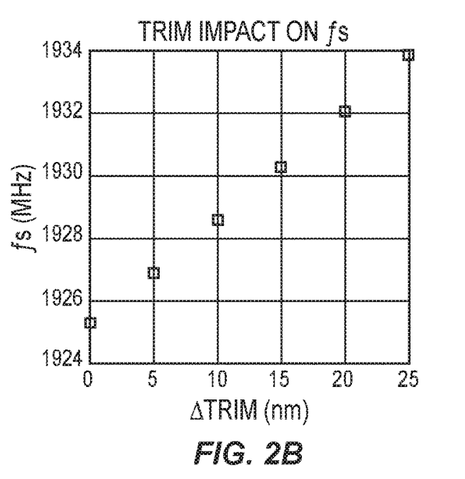
FIG. 2B is a plot representing the impact of trimming a silicon dioxide ($SiO_2$) frequency trimming layer on the fs for the simulation of FIG. 2A.
Figure 2C:
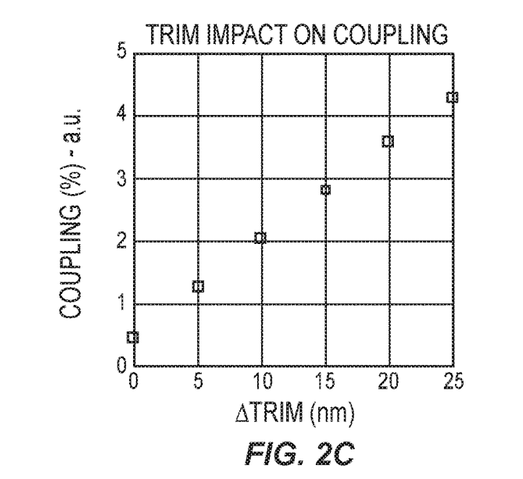
FIG. 2C is a plot representing the impact of trimming the $SiO_2$ frequency trimming layer on the coupling % for the simulation of FIG. 2A.

FIG. 2A is a simulation plot illustrating a distribution of resonance frequency fs and coupling % values in arbitrary units (a.u.) for SAW devices with differences attributed to process variations and material tolerances. The simulation results include SAW devices designed with an LT piezoelectric material, an IDT on the LT piezoelectric material, and a silicon dioxide ($SiO_2$) frequency trimming layer on the LT piezoelectric material and the IDT, all of which are configured with a nominal geometry that would produce a fs of about 1925.4 megahertz (MHz) and a coupling % denoted as about 5 a.u. These values correspond to the respective centers of the x and y axis of FIG. 2A. Simulations were run to include process variations and material tolerances for the LT piezoelectric material and the duty factor of the IDT. As shown in FIG. 2A, a wide distribution of SAW devices with varying values of fs and coupling % can be produced during a standard manufacturing process. In order to adjust the fs of a particular SAW device, a trimming step involves reducing a thickness of the $SiO_2$ frequency trimming layer. FIG. 2B is a plot representing the impact of trimming the $SiO_2$ frequency trimming layer on the fs for the simulation of FIG. 2A. The y-axis represents variation in the fs in MHz and the x-axis represents delta trim or "Δ Trim" in nm, or the amount a thickness of the $SiO_2$ frequency trimming layer has been reduced in nanometers. Accordingly, a delta trim value of 0 represents the original thickness of the $SiO_2$ frequency trimming layer, a delta trim value of 5 represents the thickness of the $SiO_2$ frequency trimming layer reduced by 5 nm, and so on. As illustrated, as the thickness of the $SiO_2$ frequency trimming layer is reduced, the fs is adjusted to higher and higher values. As previously described, adjustments to the frequency trimming layers also tend to adjust other operating parameters of the SAW device, including the coupling %. FIG. 2C is a plot representing the impact of trimming the $SiO_2$ frequency trimming layer on the coupling % for the simulation of FIG. 2A. The y-axis represents variation in the coupling % in arbitrary units (a.u.) and the x-axis represents the same delta trim (nm) as described for FIG. 2B. As illustrated, as the thickness of the $SiO_2$ frequency trimming layer is reduced, the coupling % is also adjusted to higher and higher values. This can drastically limit the amount of SAW devices that can be adjusted to a particular target fs and coupling %. By way of example, many of the data points plotted in FIG. 2A that have fs values below the center value of 1925.4 MHz also have coupling % values that are at or above the center value of about 5 a.u. Accordingly, trimming a $SiO_2$ frequency trimming layer as previously described to increase the fs value will also move the coupling % value higher and farther away from the center value.

According to embodiments disclosed herein, a SAW device may include a first trim layer and a second trim layer that are on an IDT and at least a portion of a piezoelectric material that is not covered by the IDT. The first trim layer may be configured to adjust both the fs and the coupling by reducing a thickness of the first trim layer. The second trim layer may be configured to comprise an acoustic velocity and density that correspond to a velocity of an acoustic wave in the piezoelectric material. In this regard, a thickness of the second trim layer is configured to have a reduced impact on the fs of the SAW device while still being able to adjust another parameter such as the coupling. According to certain embodiments disclosed herein, the fs for a representative SAW device may be adjusted to a target value by reducing a thickness of the first trim layer and any detrimental changes to the coupling can be compensated by reducing a thickness of the second trim layer.

Figure 3:
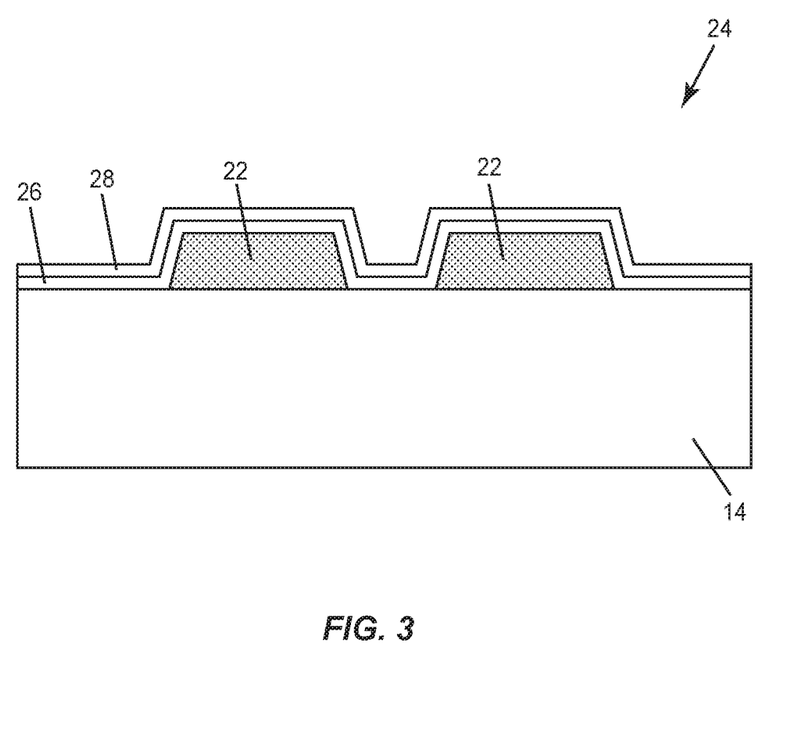
FIG. 3 is a partial cross-sectional view of a SAW device with a first trim layer and a second trim layer according to embodiments disclosed herein.

FIG. 3 is a partial cross-sectional view of a SAW device 24 with a first trim layer 26 and a second trim layer 28 according to embodiments disclosed herein. The SAW device 24 includes a piezoelectric layer 14 and electrode fingers 22 as previously described. The piezoelectric layer 14 may comprise a piezoelectric material that is in the form of a layer or a substrate. For simplicity in the drawings, only two electrode fingers 22 are illustrated in FIG. 3, however it is understood many more electrode fingers 22 may be provided that form an IDT as previously described. Additionally, other elements including reflective structures and other passivation layers, among others are not shown, but may be present as previously described. As illustrated, the first trim layer 26 is configured to cover the electrode fingers 22 that form an IDT and additionally, the first trim layer 26 is configured to cover at least a portion of the piezoelectric layer 14 that is not covered by the electrode fingers 22. In a similar manner, the second trim layer 28 is configured to cover the electrode fingers 22 and at least a portion of the piezoelectric layer 14 that is not covered by the IDT. The second trim layer 28 may be formed on the first trim layer 26 such that the first trim layer 26 is between the second trim layer 28 and the electrode fingers 22 that form an IDT. In certain embodiments, the first trim layer 26 may be configured to adjust a first operating parameter, such as fs, of the SAW device 24, and the second trim layer 26 is configured to adjust a second operating parameter, such as coupling, while having a reduced impact on the first operating parameter. The first trim layer 26 may be configured to adjust both the first operating parameter and the second operating parameter. In certain embodiments, the first trim layer 26 comprises a material such as $SiO_2$ and trimming or reducing a thickness of the first trim layer 26 can change both the fs and the coupling of the SAW device 24. In certain embodiments, the second trim layer 28 is configured to comprise an acoustic velocity and density that correspond to a velocity of an acoustic wave in the piezoelectric layer 14 such that a thickness of the second trim layer 28 has a reduced impact on the fs. The second trim layer 28 may comprise silicon nitride (SiN) or silicon oxynitride ($SiO_xN_y$) where acoustic velocities and densities can be adjustable depending on the deposition conditions. In certain embodiments, the ratio of nitrogen (N) to oxygen (O) within $SiO_xN_y$ can be configured such that the second trim layer 28 comprises an acoustic velocity and density that correspond to a velocity of an acoustic wave in the piezoelectric layer 14. Different devices may be configured to generate different acoustic waves, and $SiO_xN_y$ provides the advantage of being able to tailor the nitrogen to oxygen ratio based on a specific acoustic wave of a particular device. As illustrated in FIG. 3, the second trim layer 28 is configured on the first trim layer 26. In other embodiments, the order may be reversed such that the second trim layer 28 is configured between the first trim layer 26 and the electrode fingers 22 that form the IDT.

Figure 4A:
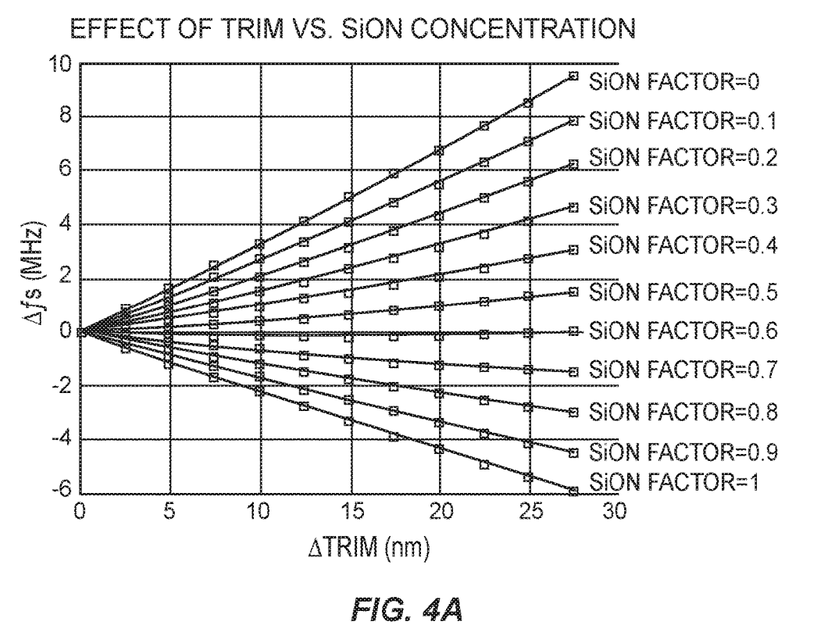
FIG. 4A is a simulation plot that illustrates the effect on fs of trimming various silicon oxynitride ($SiO_xN_y$) trim layers having different compositions, or nitrogen to oxygen ratios.

FIG. 4A is a simulation plot that illustrates the effect on fs of trimming various $SiO_xN_y$ trim layers having different compositions, or nitrogen to oxygen ratios. The y-axis represents the change in the fs in MHz, or delta fs, and the x-axis represents the delta trim (Δ Trim) in nm as previously described. Simulations were run for trim layers of $SiO_xN_y$ with various nitrogen to oxygen ratios on a common SAW device as represented by the SiON factors that range from 0 to 1. A SiON factor of 0 corresponds to a $SiO_xN_y$ trim layer of substantially $SiO_2$, a SiON factor of 0.1 corresponds to a trim layer comprising a mixture of $SiO_2$ and SiN where the oxygen content is about 10% of the total content of oxygen and nitrogen, a SiON factor of 0.9 corresponds to a trim layer comprising a mixture of $SiO_2$ and SiN where the oxygen content is about 90% of the total content of oxygen and nitrogen, and a SiON factor of 1 corresponds to a trim layer of substantially SiN. As indicated in FIG. 4A, for a SiON factor of 0, or substantially $SiO_2$, increasing delta trim thickness values result in the largest increases for the fs. For a SiON factor of 1, or substantially SiN, increasing delta trim thickness values result in the largest decreases for the fs. There are certain compositions of $SiO_xN_y$ trim layers where increases in delta trim thickness values result in little to no change or impact on the fs values. For example, for a SiON factor of 0.6, the delta fs value remains flat at or near 0 for all delta trim values. In this regard, a trim layer comprising a mixture of $SiO_2$ and SiN where the oxygen content comprises about 60% of the total content of oxygen and nitrogen, may be desirable for trim layers intended to have a reduced impact on fs for SAW devices configured for the simulation. In certain embodiments, a range of SiON factors may be suitable to provide similar results. For example, a range of SiON factors of about 0.4 to about 0.8 (or an oxygen content in a range of about 40% to about 80% of the total content of oxygen and nitrogen) provide a delta fs of less than 4 MHz variation above and below a center fs value of 0. In a similar manner, a range of SiON factors of 0.5 to about 0.7 provide a delta fs of less than 2 MHz variation above and below a center fs value of 0.

Figure 4B:
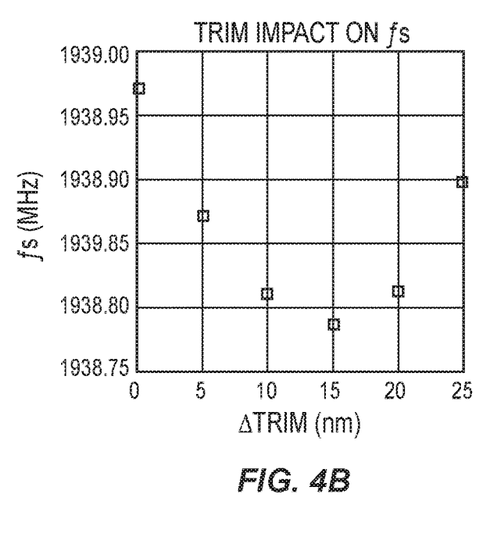
FIG. 4B is a plot representing change in fs values with increasing delta trim values for a SiON factor of 0.6 of FIG. 4A.
Figure 4C:
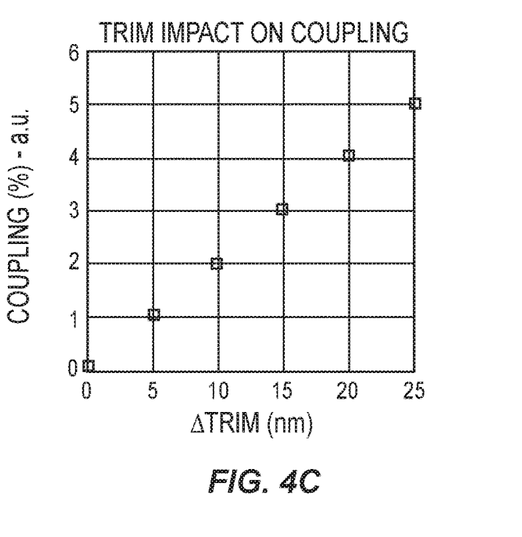
FIG. 4C is a plot representing change in coupling % values with increasing delta trim values for the SiON factor of 0.6 of FIG. 4A.

FIG. 4B is a plot representing change in fs values with increasing delta trim values for the SiON factor of 0.6 of FIG. 4A. In FIG. 4B, the y-axis represents the fs values in MHz and the x-axis represents the delta trim in nm as previously described. As shown, the entire y-axis spans a very narrow frequency range of 0.25 MHz. In this regard, for SAW devices in this simulation with a SiON factor of 0.6 for a trim layer, changes in the trim layer thickness have very little impact on the fs values. FIG. 4C is a plot representing change in coupling % values with increasing delta trim values for the SiON factor of 0.6 of FIG. 4A. In FIG. 4C, the y-axis represents the coupling % values in arbitrary units (a.u.) and the x-axis represents the delta trim in nm as previously described. As shown, the coupling % may be adjusted in a somewhat linear manner with changes to the trim layer thickness. Accordingly, a SAW device may include more than one trim layer where different trim layers are configured to have different impacts on operating parameters of the SAW device. For example, a SAW device may include a first trim layer configured to adjust a first operating parameter and a second trim layer configured to adjust a second operation parameter while having a reduced impact on the first operating parameter. By way of example, in certain embodiments, the first trim layer comprises SiN or SiO2 and is configured to adjust the fs by decreasing a thickness of the first trim layer, and the second trim layer comprises silicon oxynitride where the oxygen content is about 60% of the total oxygen and nitrogen content (SiON factor of 0.6) and decreases in thickness of the second trim layer adjust the coupling % while having a reduced impact on the fs. In other embodiments, the first and second trim layers may both comprise silicon oxynitride having different compositions. For example, the first trim layer may comprise silicon oxynitride with a SiON factor of 0.1, and the second trim layer may comprise silicon oxynitride with a SiON factor of 0.6. In this regard, adjustments to the first trim layer may change the fs values while adjustments to the second trim layer may have a reduced impact on the fs values. While SiON factors of 0.6 demonstrated the least change in the fs values for the simulations of FIG. 4A, other simulations for different configurations of SAW devices may result in different SION factors with the least change in the fs values. In this regard, compositions of trim layers may be adjusted or tailored to particular SAW configurations according to embodiments disclosed herein.

Figure 5A:
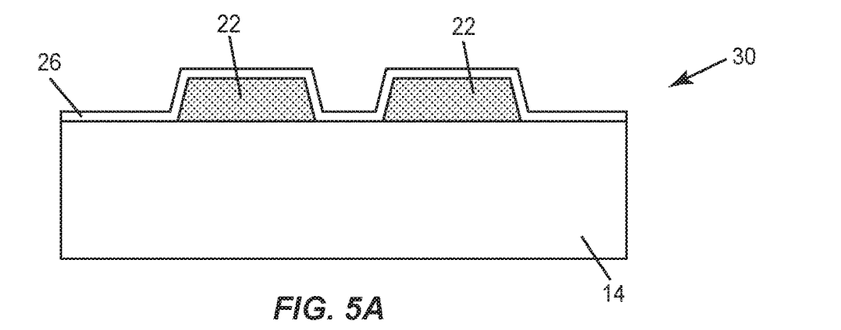
FIG. 5A illustrates a cross-sectional view after a first trim layer is deposited on an exemplary SAW device.
Figure 5B:
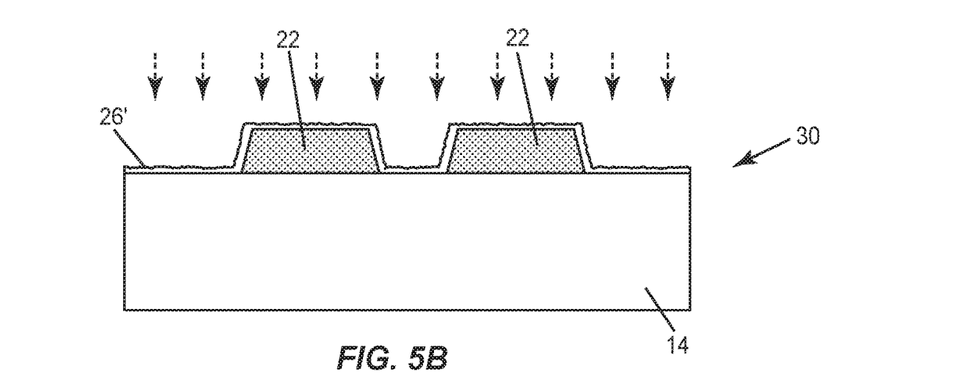
FIG. 5B illustrates a cross-sectional view of the exemplary SAW device of FIG. 5A after the first trim layer is subjected to a first trimming process.
Figure 5C:
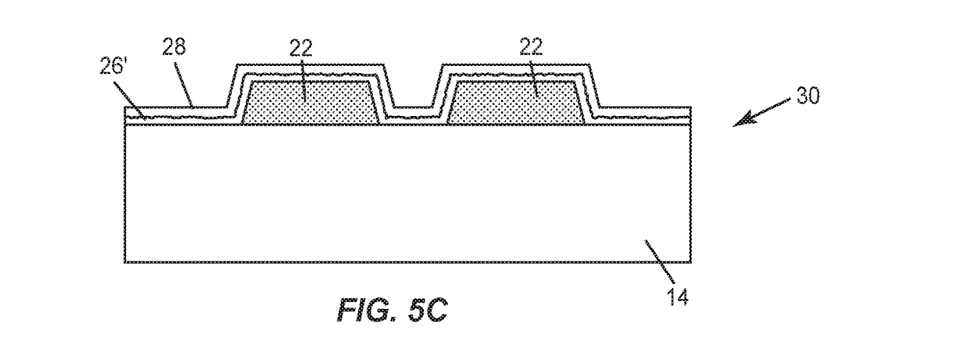
FIG. 5C illustrates a cross-sectional view after a second trim layer is deposited on the exemplary SAW device of FIGS. 5A and 5B.
Figure 5D:
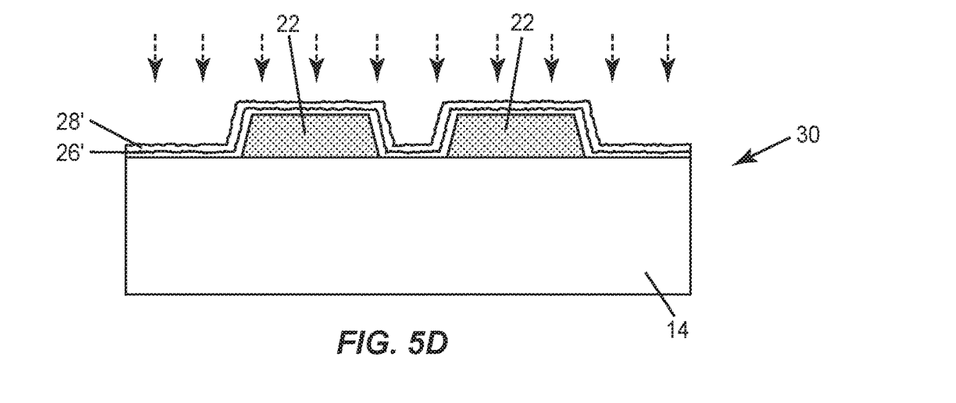
FIG. 5D illustrates a cross-sectional view of the exemplary SAW device of FIGS. 5A-5C after the second trim layer is subjected to a second trimming process.

FIGS. 5A-5B illustrate cross-sectional views of an exemplary SAW device 30 at various steps of an exemplary manufacturing process according to embodiments disclosed herein. In FIGS. 5A-5B, the exemplary SAW device 30 includes the piezoelectric layer 14 that may include a piezoelectric substrate or a piezoelectric layer on another substrate as previously described. The SAW device 30 also includes the electrode fingers 22. For simplicity in the drawings, only two electrode fingers 22 are illustrated, however it is understood many more electrode fingers 22 may be provided that form an IDT as previously described. Additionally, other elements including reflective structures and other passivation layers, among others are not shown, but may be present as previously described. In FIG. 5A, the SAW device 30 comprising the piezoelectric layer 14 and the electrode fingers 22 that form an IDT have been formed. The first trim layer 26 is then deposited on the electrode fingers 22 and at least a portion of the piezoelectric layer 14 that is not covered by the electrode fingers 22. In certain embodiments, the first trim layer 26 may be deposited by any of a variety of physical vapor deposition techniques, including sputtering, evaporation, chemical vapor deposition, plasma-enhanced chemical vapor deposition, pulsed magnetron sputtering, and ion beam sputtering, among others. As previously described, the first trim layer 26 may comprise any of $SiO_2$, SiN, or silicon oxynitride. Growth conditions during the deposition process (e.g., gas pressure, reactant gas mixture, bias voltage) can influence the composition, stoichiometry, or other properties of the first trim layer 26 in a manner that alters how adjustments to the first trim layer 26 impact various operating parameters (e.g. fs). In FIG. 5B, a trimming process as indicated by the dashed-line arrows is applied to the first trim layer 26 that reduces its thickness to form a thinned first trim layer 26'. An exemplary trimming process may include ion beam scanning with argon (Ar) ions. In certain embodiments, the thinned first trim layer 26' has localized non-uniform or roughened surfaces after the trimming process is complete. In certain embodiments, the trimming step illustrated in FIG. 5B tunes the fs value to a target frequency, however the coupling % of the SAW device 30 may have also been adjusted. In FIG. 5C, the second trim layer 28 is deposited on the thinned first trim layer 26'. The second trim layer 28 may also be deposited by physical vapor deposition and may comprise any of $SiO_2$, SiN, or silicon oxynitride, but with a different composition, stoichiometry, or other properties than the first trim layer 26. In FIG. 5D, another trimming process, such as ion beam scanning, reduces a thickness of the second trim layer 28 as indicated by the dashed-line arrows to produce a thinned second trim layer 28'. As with the thinned first trim layer 26', the thinned second trim layer 28' may have localized non-uniform or roughened surfaces after the trimming process is complete. In certain embodiments, the trimming step illustrated in FIG. 5D tunes the coupling % of the SAW device 30 to a target value, while having a reduced impact on the fs, which was tuned in the step illustrated in FIG. 5B. For simplicity, FIGS. 5A-5D focus on the singular SAW device 30. In certain embodiments, the steps represented in FIGS. 5A-5D can be performed on groups of SAW devices at the same time. For example, the steps represented in FIGS. 5A-5D may be applied to a plurality of SAW devices that are formed on a common substrate before individual SAW devices are singulated from the common substrate.

Figure 6A:
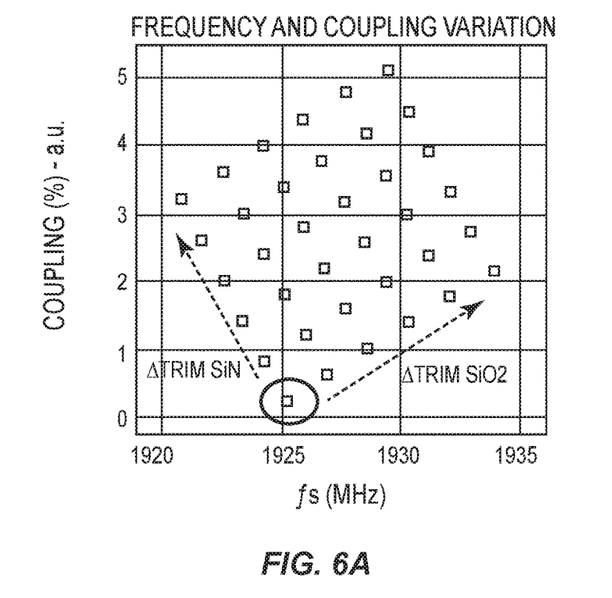
FIG. 6A is a simulation plot representing fs and coupling % variations for two different trim layers according to embodiments disclosed herein.
Figure 6B:
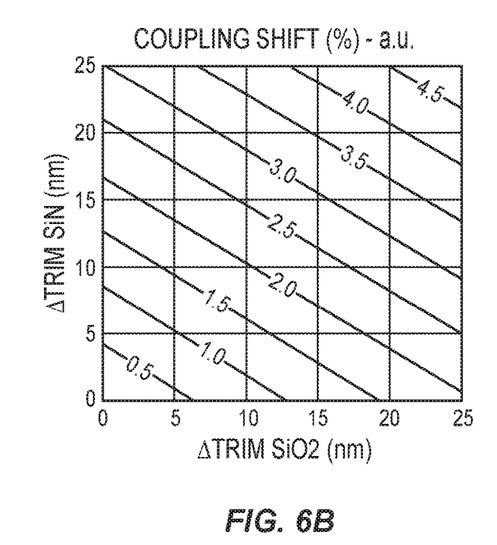
FIG. 6B illustrates the coupling shift % for different combinations of trimming for the trim layers represented by FIG. 6A.
Figure 6C:
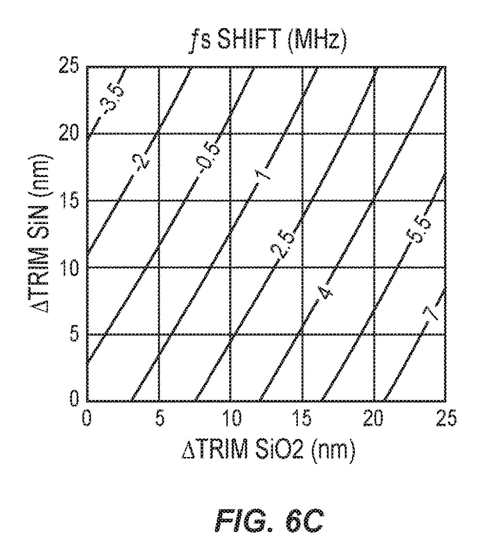
FIG. 6C illustrates the fs in megahertz (MHz) for different combinations of trimming for the trim layers represented by FIG. 6A.

In certain embodiments, a SAW device may include two different trim layers, each of which are configured to adjust both fs and coupling in different manners. FIG. 6A is a simulation plot representing fs and coupling % variations for two different trim layers. As previously described, the fs response is different between $SiO_2$ and SiN such that separately trimming a layer of $SiO_2$ will adjust the fs of a SAW device higher, while trimming a layer of SiN will adjust the fs of the same SAW device lower. In FIG. 6A, the y-axis represents the coupling % in arbitrary units (a.u.) and the x-axis represents the fs in MHz as previously described. For the simulation results, a starting SAW device includes a $SiO_2$ trim layer and separate SiN trim layer. The fs and coupling % data point for the starting SAW device if neither of the trim layers are trimmed is indicated by the circle in FIG. 6A. The remaining data points indicate different SAW devices with various combinations of thickness reductions for each of the trim layers. As indicated in FIG. 6A, as the SiN layer is trimmed (e.g. thickness reduction), the fs value deceases and the coupling % increases. In contrast, as the $SiO_2$ layer is trimmed, the fs value and the coupling % increase. Accordingly, any combination of fs and coupling % within the group of data points can be achieved. FIG. 6B illustrates the coupling shift for different combinations of trimming for the trim layers represented by FIG. 6A. The y-axis represents the delta trim value for the SiN layer in nm and the x-axis represents the delta trim value for the $SiO_2$ layer in nm. The diagonal lines with values ranging from 0.5 to 4.5 represent coupling % values in arbitrary units (a.u.) for different combinations of delta trim values for the SiN and $SiO_2$ layers. In other words, the diagonal 2 line represents all combinations of thickness reductions for the SiN and $SiO_2$ trim layers that will shift the coupling % about 2 a.u. higher. FIG. 6C illustrates the fs in MHz for different combinations of trimming for the trim layers represented by FIG. 6A. The x-axis and y-axis are labeled the same as in FIG. 6B. The diagonal lines in FIG. 6C with values ranging from −3.5 to 7 represent the fs values for different combinations of the delta trim values for the SiN and $SiO_2$ layers. When viewed together, FIGS. 6B and 6C provide how much each of the SiN and $SiO_2$ layers should be trimmed to arrive at a particular combination of coupling % and fs. Specifically, by overlaying the coupling % lines of FIG. 6B with the fs lines of FIG. 6C, intersections between the coupling % lines and the fs lines indicate precise thickness reductions needed for each of the trim layers. While the examples of FIGS. 6A-6C include separate trim layers of SiN and $SiO_2$, other combinations of materials may be provided according to embodiments disclosed herein. For example, at least one of the trim layers may comprise silicon oxynitride. In other embodiments, both of the trim layers comprise silicon oxynitride with varying compositions.

In certain embodiments as disclosed herein, a SAW device includes a single trim layer that comprises an acoustic velocity and density that is tailored to compensate for specific operating parameter variations. Different structural parameters of SAW devices, including different combinations and thickness of piezoelectric materials, oxide layers, and duty factors, among others, may provide larger variations for some operating parameters and smaller variations for other operating parameters. In this regard, a single trim layer may be configured to adjust the operating parameters with the highest variations by the largest amounts while simultaneously adjusting the operating parameters with the lowest variations by the lowest amounts.

Figure 7A:
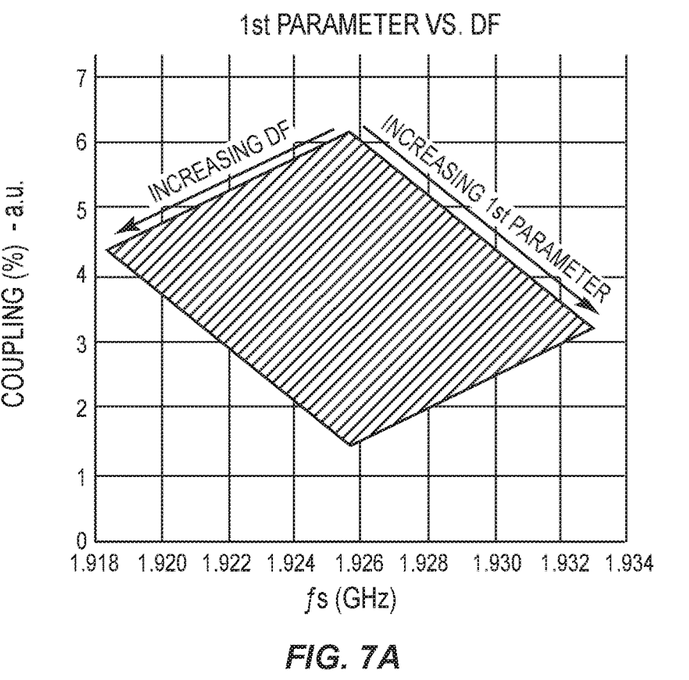
FIG. 7A represents simulation results for representative SAW devices with a reference configuration and variations of certain structural parameters.
Figure 7B:
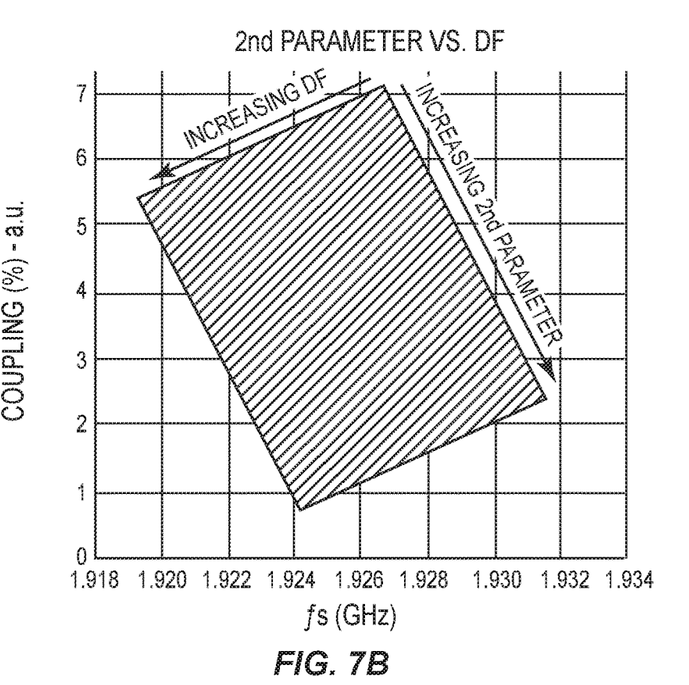
FIG. 7B represents simulation results for representative SAW devices with a different reference configuration and variations of different structural parameters.

FIG. 7A represents simulation results for representative SAW devices with a reference configuration and variations of certain structural parameters. In the simulation, a first structural parameter is varied along with a duty factor (DF) of the representative SAW device to account for common manufacturing or material variations. In this regard, the shaded box in FIG. 7A represents a range of coupling % values in arbitrary units (a.u) and fs values that may be produced. As indicated, variations in the duty factor values define a first dimension of the shaded box while variations in the first structural parameter define a second dimension of the shaded box. In a similar manner, FIG. 7B represents simulations for representative SAW devices with a different reference configuration and variations of different structural parameters. In particular, a second structural parameter is varied along with a duty factor to provide the range of values illustrated by the shaded box in FIG. 7B. As illustrated, variations to the first structural parameter have a greater impact on the fs than variations to the second structural parameter. This is represented by the larger width of the shaded box of FIG. 7A relative to the x-axis compared to the shaded box of FIG. 7B. In contrast, variations to the second structural parameter have a greater impact on coupling % than variations to the first structural parameter, as indicated by differences in heights of the shaded boxes relative to the y-axis. In this regard, for SAW devices that typically experience parameter variations similar to FIG. 7A, a trim layer may be provided that is tailored to adjust the fs by greater amounts than the coupling % as a thickness of the trim layer is reduced. In a similar manner, for SAW devices that typically experience parameter variations similar to FIG. 7B, a trim layer may be provided that is tailored to adjust the coupling % by greater amounts than the fs as a thickness of the trim layer is reduced. As previously described, exemplary trim layer materials of silicon oxynitride or SiN may be tailored based on compositions and deposition conditions.

Figure 8:
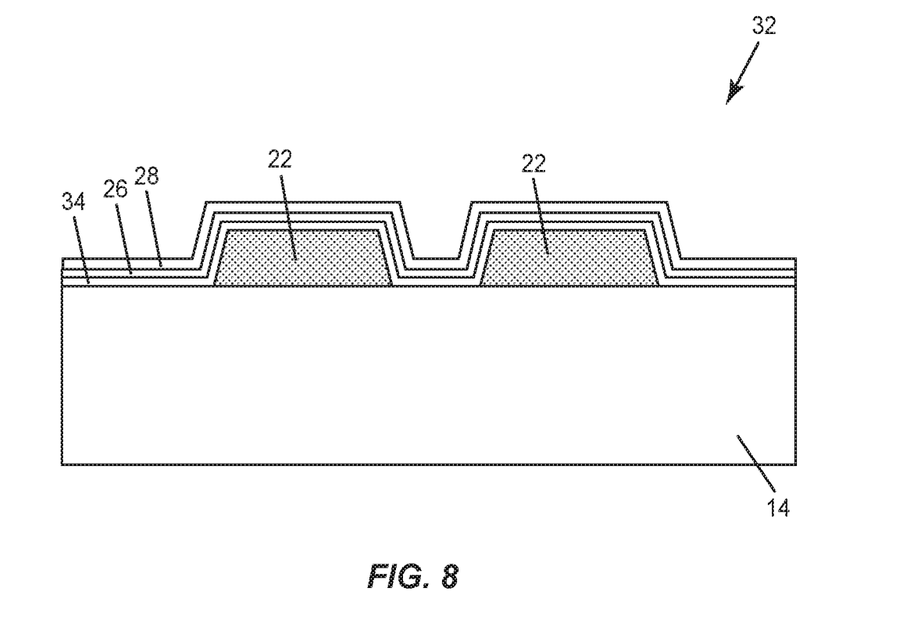
FIG. 8 a partial cross-sectional view of a SAW device with a passivation layer and one or more trim layers according to embodiments disclosed herein.

FIG. 8 is a partial cross-sectional view of a SAW device 32 with a passivation layer 34 in addition to one or more trim layers as previously described. As illustrated, the SAW device 32 includes the piezoelectric layer 14, the electrode fingers 22, the first trim layer 26, and the second trim layer 28 as previously described. The first trim layer 26 and the second trim layer 28 may cover the electrode fingers 22 that form an IDT and, additionally, the first trim layer 26 and the second trim layer 28 may cover at least a portion of the piezoelectric layer 14 that is not covered by the electrode fingers 22. In certain embodiments, the second trim layer 28 may be formed on the first trim layer 26 such that the first trim layer 26 is between the second trim layer 28 and the electrode fingers 22 that form the IDT. In certain embodiments, the first trim layer 26 may be configured to adjust a first operating parameter, such as fs, of the SAW device 32, and the second trim layer 28 is configured to adjust a second operating parameter, such as coupling, while having a reduced impact on the first operating parameter. The first trim layer 26 may be configured to adjust both the first operating parameter and the second operating parameter. In certain embodiments, the passivation layer 34 is configured to cover, or conformally cover, the electrode fingers 22 and the portion of the piezoelectric layer 14 that is not covered by the electrode fingers 22. In certain embodiment, the passivation layer 34 is between the first and second trim layers 26, 28 and the piezoelectric layer 14. In other embodiments, the passivation layer 34 may be configured between the first trim layer 26 and the second trim layer 28, or the passivation layer 34 may be configured on top of the SAW device 32 such that both of the trim layers 26,28 are configured between the passivation layer 34 and the piezoelectric layer 14. In certain embodiments, the passivation layer 34 may include multiple passivation layers. The passivation layer 34 may include SiN or other dielectric materials configured to passivate one or more surfaces of the SAW device 32. In certain embodiments, the passivation layer 34 may also be configured as a trim layer as previously described. In this manner, the passivation layer 34 may be trimmed to adjust at least one of the first operating parameter or the second operating parameter of the SAW device 32 while still maintaining passivation function.

Figure 9:
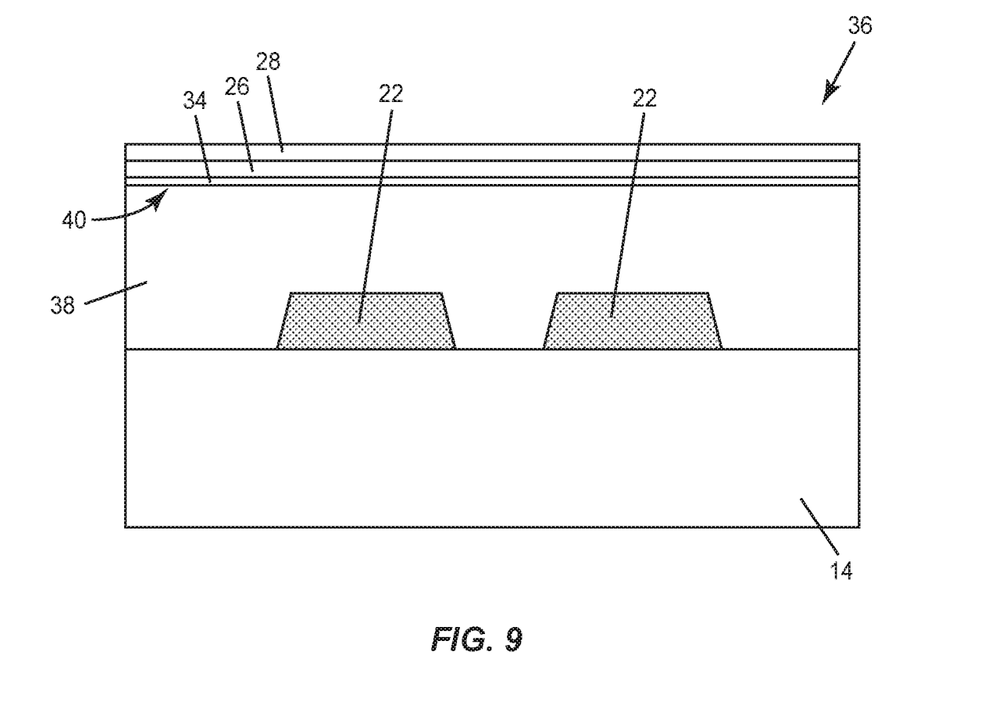
FIG. 9 is a partial cross-sectional view of a temperature-compensated SAW (TCSAW) device according to embodiments disclosed herein.

FIG. 9 is a partial cross-sectional view of a temperature-compensated SAW (TCSAW) device 36 according to embodiments disclosed herein. As illustrated, the TCSAW device 36 includes the piezoelectric layer 14, the electrode fingers 22, the first trim layer 26, the second trim layer 28, and the passivation layer 34 as previously described. The TCSAW device 36 additionally includes a dielectric layer 38, such as $SiO_2$, that is configured between the first trim layer 26 and the piezoelectric layer 14 as well as the electrode fingers 22 to reduce temperature sensitivity or a temperature coefficient of frequency of the TCSAW device 36. In certain embodiments, the dielectric layer 38 includes a dopant, such as fluorine (F) or boron (B) that may further reduce the temperature sensitivity of the TCSAW device 36. In certain embodiments, the dielectric layer 38 is configured with a thickness that is greater than a thickness of the electrode fingers 22. A top surface 40 of the dielectric layer 38, opposite the piezoelectric layer 14, may be planarized before the passivation layer 34 and the trim layers 26, 28 are formed. In other embodiments, the dielectric layer 38 is not planarized and, accordingly, the top surface 40 comprises a conformal shape over the electrode fingers 22. As with previous embodiments, the passivation layer 34 may also be configured as a trim layer that is in addition to or in place of at least one of the first and second trim layers 26, 28.

Those skilled in the art will recognize improvements and modifications to the preferred embodiments of the present disclosure. All such improvements and modifications are considered within the scope of the concepts disclosed herein and the claims that follow.

What is claimed is:
1. A surface acoustic wave (SAW) device, comprising:
a piezoelectric material;
an interdigital transducer (IDT) on the piezoelectric material;
a first trim layer configured to cover the IDT and at least a portion of the piezoelectric material that is not covered by the IDT such that a portion of the first trim layer is directly on the piezoelectric material and a top surface of the first trim layer forms a shape that is conformal to the IDT and the piezoelectric material, wherein the first trim layer is configured to adjust a first operating parameter of the SAW device and the top surface of the first trim layer comprises a roughened surface; and
a second trim layer directly on the first trim layer and configured to cover the IDT and at least a portion of the piezoelectric material that is not covered by the IDT, wherein the second trim layer is configured to adjust a second operating parameter while having a reduced impact on the first operating parameter and a top surface of the second trim layer comprises another roughened surface, wherein the second trim layer comprises silicon oxynitride;
wherein a combination of a thickness of the first trim layer and a thickness of the second trim layer is less than a thickness of the IDT.

2. The SAW device of claim 1, wherein the first operating parameter is a resonance frequency of the SAW device and the second operating parameter is an electromechanical coupling of the SAW device.

3. The SAW device of claim 2, wherein the second trim layer comprises an acoustic velocity and a density that correspond to a velocity of an acoustic wave in the piezoelectric material such that the thickness of the second trim layer has a reduced impact on the resonance frequency.

4. The SAW device of claim 1, wherein the first trim layer is configured to adjust the first operating parameter and the second operating parameter of the SAW device.

5. The SAW device of claim 1, wherein the first trim layer is configured between the second trim layer and the IDT.

6. The SAW device of claim 1, wherein the silicon oxynitride comprises an oxygen content in a range of 50% to 70% of a total content of oxygen and nitrogen.

7. The SAW device of claim 1, wherein the first trim layer comprises silicon nitride or silicon dioxide.

8. The SAW device of claim 1, wherein the first trim layer comprises silicon oxynitride having a different composition than the second trim layer.

9. The SAW device of claim 1, further comprising a passivation layer that is configured to cover the IDT and at least a portion of the piezoelectric material that is not covered by the IDT.

10. The SAW device of claim 9, wherein the passivation layer is configured to adjust at least one of the first operating parameter or the second operating parameter.

11. The SAW device of claim 1, further comprising a passivation layer, wherein the first trim layer and the second trim layer are both between the passivation layer and the piezoelectric material.

12. The SAW device of claim 1, wherein the silicon oxynitride comprises an oxygen content in a range of 40% to 80% of a total content of oxygen and nitrogen.

13. A method comprising:
forming a surface acoustic wave (SAW) device comprising a piezoelectric material and an interdigital transducer (IDT) that is on the piezoelectric material;
depositing a first trim layer on and covering the IDT and at least a portion of the piezoelectric material that is not covered by the IDT such that a portion of the first trim layer is directly on the piezoelectric material and a top surface of the first trim layer forms a shape that is conformal to the IDT and the piezoelectric material, wherein the first trim layer is configured to adjust a first operating parameter of the SAW device;
reducing a thickness of the first trim layer, wherein the top surface of the first trim layer comprises a roughened surface;
depositing a second trim layer directly on the first trim layer after the thickness of the first trim layer has been reduced, the second trim layer covering the IDT and at least a portion of the piezoelectric layer that is not covered by the IDT, wherein the second trim layer is configured to adjust a second operating parameter while having a reduced impact on the first operating parameter wherein the second trim layer comprises silicon oxynitride; and
reducing a thickness of the second trim layer, wherein a top surface of the second trim layer comprises another roughened surface, and a combination of the thickness of the first trim layer and the thickness of the second trim layer is less than a thickness of the IDT.

14. The method of claim 13, wherein the first trim layer comprises silicon oxynitride.

15. The method of claim 13, wherein the first trim layer or the second trim layer comprises an acoustic velocity and a density that correspond to a velocity of an acoustic wave in the piezoelectric material.

16. The method of claim 15, wherein the acoustic velocity and the density of the first trim layer or the second trim layer is configured such that the thickness of the first trim layer or the second trim layer has a reduced impact on a resonance frequency of the SAW device.

17. The method of claim 13, wherein the silicon oxynitride comprises an oxygen content in a range of 40% to 80% of a total content of oxygen and nitrogen.

18. A wireless device, comprising:
one or more surface acoustic wave (SAW) devices, wherein at least one of the one or more SAW devices comprises:
a piezoelectric material;
an interdigital transducer (IDT) on the piezoelectric material;
a first trim layer configured to cover the IDT and at least a portion of the piezoelectric material that is not covered by the IDT such that a portion of the first trim layer is directly on the piezoelectric material and a top surface of the first trim layer forms a shape that is conformal to the IDT and the piezoelectric material, wherein the first trim layer comprises silicon oxynitride and the top surface of the first trim layer comprises a roughened surface; and
a second trim layer directly on the first trim layer and configured to cover the IDT and at least a portion of the piezoelectric material that is not covered by the IDT, wherein a top surface of the second trim layer comprises another roughened surface, wherein the second trim layer comprises silicon oxynitride and a combination of a thickness of the first trim layer and a thickness of the second trim layer is less than a thickness of the IDT.

19. The wireless device of claim 18, wherein the first trim layer comprises an acoustic velocity and a density that are configured such that the thickness of the first trim layer changes a resonance frequency of the SAW device by a greater amount than an electromechanical coupling of the SAW device.

20. The wireless device of claim 18, wherein the first trim layer comprises an acoustic velocity and a density that are configured such that the thickness of the first trim layer changes an electromechanical coupling of the SAW device by a greater amount than a resonance frequency of the SAW device.

21. The wireless device of claim 18, wherein the second trim layer comprises silicon oxynitride with a different composition than the first trim layer.

22. The wireless device of claim 18, wherein the silicon oxynitride comprises an oxygen content in a range of 40% to 80% of a total content of oxygen and nitrogen.

* * * * *

UNITED STATES PATENT AND TRADEMARK OFFICE
CERTIFICATE OF CORRECTION

PATENT NO. : 12,166,466 B2
APPLICATION NO. : 16/212809
DATED : December 10, 2024
INVENTOR(S) : Sebastian Huebner Page 1 of 1

It is certified that error appears in the above-identified patent and that said Letters Patent is hereby corrected as shown below:

In the Specification

In Column 6, Line 23, replace "wavelength A" with --wavelength $\lambda$--.

In Column 6, Line 27, replace "wavelength A" with --wavelength $\lambda$--.

In Column 6, Line 29, replace "wavelength A" with --wavelength $\lambda$--.

Signed and Sealed this
Fourteenth Day of January, 2025

Derrick Brent
*Acting Director of the United States Patent and Trademark Office*